US008446772B2

(12) United States Patent
Tu et al.

(10) Patent No.: US 8,446,772 B2
(45) Date of Patent: May 21, 2013

(54) MEMORY DIE SELF-DISABLE IF PROGRAMMABLE ELEMENT IS NOT TRUSTED

(75) Inventors: Loc Tu, San Jose, CA (US); Charles Moana Hook, Patterson, CA (US); Nyi Nyi Thein, Lathrop, CA (US)

(73) Assignee: SanDisk Technologies Inc., Plano, TX (US)

( * ) Notice: Subject to any disclaimer, the term of this patent is extended or adjusted under 35 U.S.C. 154(b) by 120 days.

(21) Appl. No.: 13/198,606

(22) Filed: Aug. 4, 2011

(65) Prior Publication Data
US 2013/0033935 A1 Feb. 7, 2013

(51) Int. Cl.
*G11C 11/34* (2006.01)
(52) U.S. Cl.
USPC .................................. 365/185.18; 365/185.24
(58) Field of Classification Search
USPC ........................................ 365/185.18, 185.24
See application file for complete search history.

(56) References Cited

U.S. PATENT DOCUMENTS

| 5,430,859 A | 7/1995 | Norman et al. |
| 5,502,667 A | 3/1996 | Bertin et al. |
| 5,508,971 A | 4/1996 | Cernea et al. |
| 5,581,498 A | 12/1996 | Ludwig et al. |
| 5,627,838 A | 5/1997 | Lin et al. |
| 5,668,774 A | 9/1997 | Furutani |
| 5,862,391 A | 1/1999 | Salas et al. |
| 5,987,623 A | 11/1999 | Ushida |
| 5,999,480 A | 12/1999 | Ong et al. |
| 6,148,363 A | 11/2000 | Lofgren et al. |
| 6,282,130 B1 | 8/2001 | Cernea et al. |
| 6,426,893 B1 | 7/2002 | Conley et al. |
| 6,456,099 B1 | 9/2002 | Eldridge et al. |
| 6,512,392 B2 * | 1/2003 | Fleury et al. ............. 324/762.03 |
| 6,621,260 B2 | 9/2003 | Eldridge et al. |
| 6,639,848 B2 | 10/2003 | Maejima |
| 6,651,202 B1 | 11/2003 | Phan |
| 6,731,122 B2 * | 5/2004 | Feng ........................ 324/762.03 |
| 6,732,446 B2 * | 5/2004 | Liao et al. ......................... 34/75 |

(Continued)

FOREIGN PATENT DOCUMENTS

| DE | 10203129 A1 | 8/2003 |
| EP | 1811525 A2 | 7/2007 |

OTHER PUBLICATIONS

International Search Report and Written Opinion of the International Searching Authority dated Nov. 30, 2012, PCT Patent Application No. PCT/US2012/048818, filed Jul. 30, 2012, 10 pages.

(Continued)

*Primary Examiner* — Michael Tran
(74) *Attorney, Agent, or Firm* — Vierra Magen Marcus LLP (57) ABSTRACT

Techniques are disclosed herein for automatically self-disabling a memory die in the event that a programmable element on the memory die for indicating whether the memory die is defective cannot be trusted. Memory die are provided with chip enable circuitry to allow particular memory die to be disabled. If the programmable element can be trusted, the state of the programmable element is provided to the chip enable circuitry to enable/disable the memory die based on the state. However, if the programmable element cannot be trusted, then the chip enable circuitry may automatically disable the memory die. This provides a greater yield for multi-chip memory packages because packages having memory die with a programmable element that cannot be trusted can still be used.

24 Claims, 8 Drawing Sheets

U.S. PATENT DOCUMENTS

| | | |
|---|---|---|
| 6,862,700 B2 | 3/2005 | Zhu et al. |
| 7,020,739 B2 | 3/2006 | Mukaida et al. |
| 7,053,470 B1 | 5/2006 | Sellers et al. |
| 7,054,705 B2 | 5/2006 | Ogawa et al. |
| 7,114,659 B2 | 10/2006 | Harari et al. |
| 7,149,871 B2 | 12/2006 | Conley |
| 7,184,306 B2 | 2/2007 | Conley et al. |
| 7,327,590 B2 | 2/2008 | Matsui et al. |
| 7,336,519 B2 | 2/2008 | Ishii |
| 7,350,108 B1 | 3/2008 | Dean et al. |
| 7,388,782 B2 | 6/2008 | Tokiwa |
| 7,402,897 B2 | 7/2008 | Leedy |
| 7,437,602 B2 | 10/2008 | Asari et al. |
| 7,477,545 B2 | 1/2009 | Tu et al. |
| 7,561,482 B2 | 7/2009 | Tu et al. |
| 7,609,561 B2 | 10/2009 | Cornwell et al. |
| 7,715,255 B2 | 5/2010 | Tu et al. |
| 7,894,232 B2 | 2/2011 | Hanzawa et al. |
| 7,894,262 B2 | 2/2011 | Shirakawa et al. |
| 2003/0026136 A1 | 2/2003 | Maejima |
| 2005/0278666 A1 | 12/2005 | Diamond |
| 2006/0132167 A1 | 6/2006 | Chen |
| 2007/0076478 A1 | 4/2007 | Sanders |
| 2008/0311684 A1 | 12/2008 | Tu et al. |
| 2010/0145646 A1* | 6/2010 | Baseman et al. ................. 702/81 |
| 2011/0234253 A1* | 9/2011 | Bhaskarani ............... 324/762.03 |

OTHER PUBLICATIONS

English Abstract of foreign patent document DE10203129, published Aug. 7, 2003, Applicant Infineon Technologies, 1 page.

International Search Report and Written Opinion of the International Searching Authority dated Aug. 21, 2008, Patent Corporation Treaty, PCT Application No. PCT/US2008/066111, filed Jun. 6, 2008, 7 pages.

Office Action dated Jun. 24, 2009, U.S. Appl. No. 11/763,287, filed Jun. 14, 2007, 19 pages.

Response to Office Action dated Oct. 26, 2009, U.S. Appl. No. 11/763,287, filed Jun. 14, 2007, 11 pages.

Notice of Allowance and Fee(s) Due dated Dec. 29, 2009, U.S. Appl. No. 11/763,287, filed Jun. 14, 2007, 7 pages.

Notice of Allowance and Fee(s) Due dated Oct. 8, 2008, U.S. Appl. No. 11/763,292, filed Jun. 14, 2007, 15 pages.

* cited by examiner

MEMORY DIE SELF-DISABLE IF PROGRAMMABLE ELEMENT IS NOT TRUSTED

BACKGROUND

Semiconductor-based memory, including volatile memory such as dynamic or static random access memory and non-volatile memory such as flash memory have become more popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM), including flash EEPROM, and Electrically Programmable Read Only Memory (EPROM), are among the most popular non-volatile semiconductor memories.

As with most storage devices, semiconductor memory devices may have defective components or storage areas. For example, the individual storage elements or memory cells of a semiconductor memory array may be defective. Additionally, circuitry for the memory array, including word lines, bit lines, decoders, etc., may be defective, rendering associated storage elements defective as well.

Some defect management schemes rely on redundant memory cells to replace primary memory cells that are determined to be defective. During typical semiconductor memory fabrication processes such as that depicted in FIG. 1, wafer level testing 12 is conducted prior to packaging memory chips to form memory devices. A wafer can include hundreds or thousands of memory chips, each of which may include a memory array and peripheral components such as the control and logic circuits for accessing the memory cells of the array. During wafer level testing 12, the functionality of the memory chips is tested so that defective components are not needlessly integrated into a packaged device. Wafer level testing is often conducted at raised and/or lowered temperatures (e.g., 85° C. and/or −30° C.) to ensure functionality at extreme conditions and to ensure functionality after stressing the circuits. Memory cells that fail functionality testing can be replaced with redundant memory cells from the chip. Depending on the type of memory being manufactured, different redundancy schemes can be employed. For example, individual memory cells can be replaced, entire columns or bit lines of memory cells can be replaced, or entire blocks of memory cells can be replaced.

Figure 1:
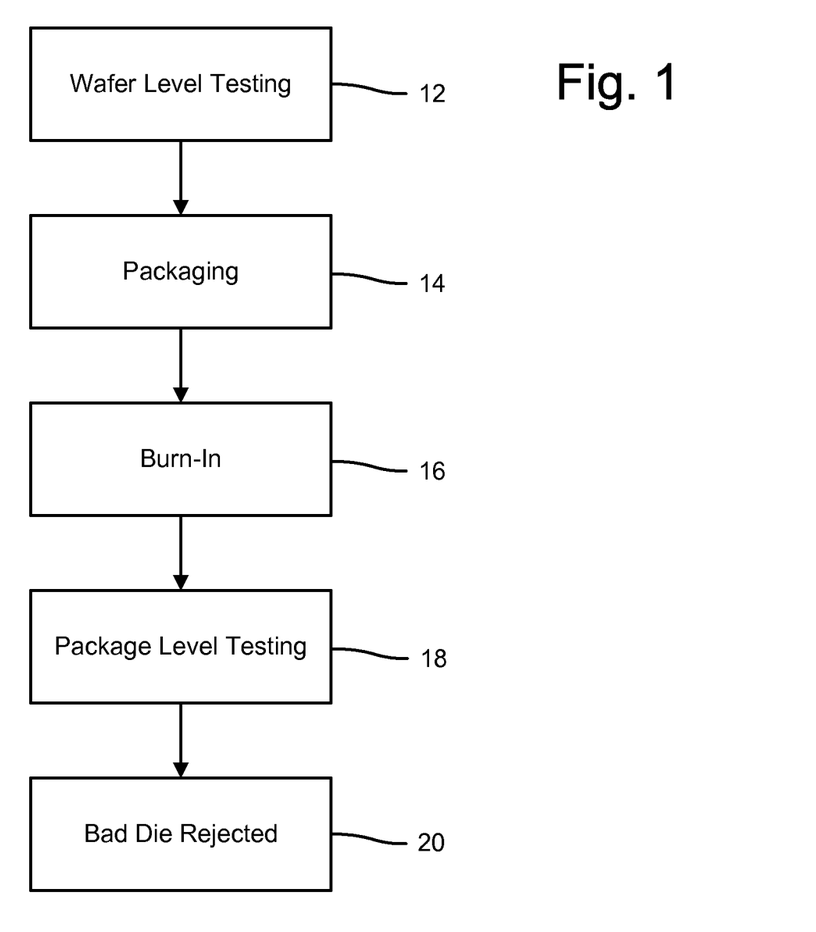
FIG. 1 is a flowchart describing a conventional method of manufacturing memory.

After wafer level testing 12, the wafer is divided into individual memory chips and one or more of the memory chips are packaged 14 to form a memory device. Packaged memory devices are then subjected to a burn-in process 16 to stress the memory arrays and peripheral circuitry of the chips. Burn-in is typically conducted under even higher temperatures (e.g., 125° C.) than wafer level testing. High voltages are applied at various portions of each chip to stress and identify weaker elements. The stress conditions of the burn-in process are designed to cause failure of weaker devices which can later be detected during package level testing 18. In some manufacturing processes, burn-in is not performed.

Package level testing usually consists of various functionality tests to determine which cells are defective subsequent to burn-in. In recent years, techniques such as anti-fuses have been incorporated into fabrication processes so that memory cells that are found to be defective subsequent to burn-in can be replaced by redundant memory from the memory chip.

In some instances, package level testing 18 results in the identification of entire memory chips that are defective. For instance, the number of defective memory cells of the array may exceed the redundancy capacity for the die or certain peripheral circuitry may fail, causing the die to be unusable. Defective memory die may be rejected 20. However, there problems to overcome when rejecting one memory die in a memory package having multiple memory dice.

DETAILED DESCRIPTION

As noted herein, testing (e.g., package level testing) may identify a memory die in a multi-die package that is defective. For example, the number of defective memory cells of the memory array on that die may exceed the redundancy capacity or certain peripheral circuitry may fail, causing the die to be unusable. In one embodiment, a programmable element on a memory die in a multi-die package stores in indication of whether that memory die is defective. However, in some cases the programmable element cannot be trusted. For example, the nature of the defect may make a region of a memory array that contains the programmable element untrusted. However, techniques disclosed herein allow a multi-die package having such a defective die to be used anyway. If that programmable element cannot be trusted during use, then the memory die self-disables upon power on reset (POR), in one embodiment. This allows for greater yield, as multi-die packages that might otherwise need to be discarded may be used.

Upon POR, circuitry on a defective memory die may be used to prevent the defective memory die from being used in the field. For example, the memory package can be shipped with seven out of eight memory die still functional. However, the defective memory die may contain circuitry that prevents it from being used by self-disabling the memory die. For example, the defective memory die has circuitry that overrides its chip enable signal upon POR. The circuitry may read a programmable element that stores in indication of whether the memory die is defective. One example of such a programmable element is one or more memory cells in flash memory on the defective memory die. The memory dice that are functional may also have this circuitry and programmable element. However, in their case their programmable element is set to indicate that the memory die is functional.

As noted, in some cases, the programmable element that indicates whether the memory die is defective cannot be trusted. For example, the very portion of non-volatile storage that contains the programmable element may be defective. In such a case, rather than discarding the entire memory package, steps may be taken on POR to detect that the programmable element itself is defective and to automatically disable that memory die upon POR, in some embodiments. This may allow for a substantial increase in yield. For example, a significant number of memory packages may have at least one memory die for which the very programmable element that is used to store the indication that the memory die is defective cannot be trusted. However, embodiments disclosed herein are able to ship such memory packages.

One embodiment includes the following. Upon POR (in the field), a determination is made as to whether a programmable element for indicating whether the memory die is defective can be trusted. As one example, a checksum is performed of a region of non-volatile storage that contains the programmable element. However, many other techniques could be used to determine whether the programmable element can be trusted. If the programmable element cannot be trusted, then an "external" chip enable signal that is provided to the memory die is over-ridden. Therefore, the memory die is prevented from being used in the field. Note that in some embodiments, the external chip enable signal is common to all of the memory die in the package.

On the other hand, if the programmable element on a given memory die can be trusted, then the programmable element may be read to determine whether or not to use that memory die. For example, if the programmable element indicates that the memory die is defective, then the memory die may self-disable upon POR. In one embodiment, an "internal" chip enable signal (internal in the sense that it may be generated inside the defective memory die) that over-rides the external chip enable (external in the sense that it may be provided to the defective memory die) signal is generated. If the programmable element indicates that the memory die is not defective, then the memory die is not disabled upon POR. Note that "not disabling the memory die" will be understood to mean that the external chip enable signal is allowed to enable the memory die.

Figure 2:
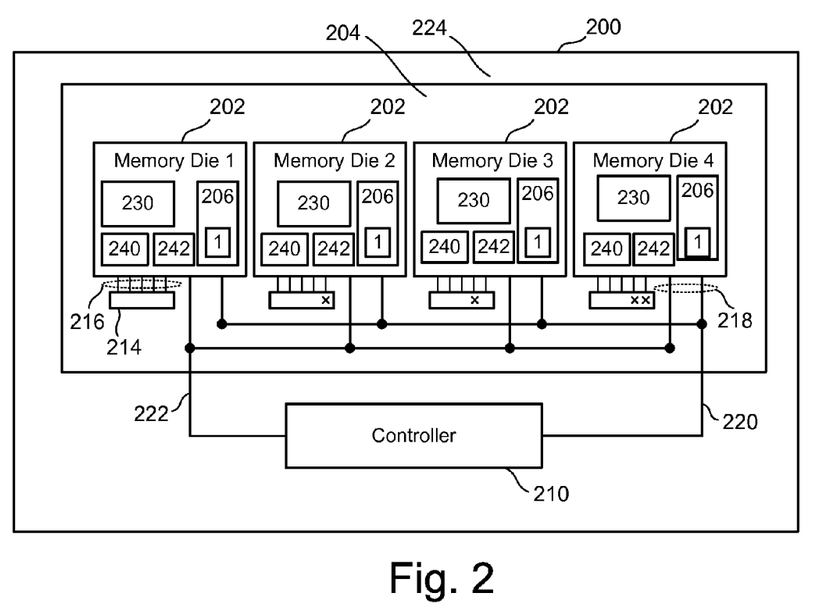
FIG. 2 is a block diagram of a memory package in accordance with one embodiment.

FIG. 2 schematically illustrates one embodiment of a non-volatile memory system 200 having a number of individual memory die 202 and a controller 210. Each memory die is an integrated circuit memory chip or die mounted on a substrate or printed circuit board 204. The controller 210 is also an integrated circuit chip or die mounted on its own printed circuit board 224. The two printed circuit boards can be mounted to a third printed circuit board (not illustrated). In other embodiments, the controller and memory die may be mounted on the same board.

Each memory die 202 includes a non-volatile memory array 206 formed of individual non-volatile memory cells. The memory array can include, but is not limited to, flash memory cells arranged using architectures such as the NAND and NOR architectures. The memory die 202 each include peripheral circuitry for addressing and controlling their respective memory array. The controller 210 is included in the memory system to control memory operations between a host device and the individual memory die 202. The controller 210 is capable of independently addressing each memory die of the system. It is not necessary that a controller be included in the memory system. For instance, some implementations may have the controller functionality handled by the host device, such as by a processor of a standard processor-based computing system. Furthermore, multiple memory die 202 may be packaged in a single package without a controller and be subsequently combined with other packages and a controller to form the memory system.

Each memory die 202 includes two sets of external pinouts or pins. A first group of pinouts 216 for each die is a group of device select pins. The device select pins provide the memory device with a unique chip address for the packaged memory system. The device select pins of each die are connected to a set of bonding pads 214 for that die. In this particular configuration, each memory die 202 has five device select pinouts 216 that are connected to five corresponding pads 214. By selectively grounding particular pads for a memory die, the memory die is configured or keyed with an address. A predetermined grounding configuration for the pads can be provided for an individual memory die to assign it a unique chip address within the package. Substrate 204 can include mounts with predetermined pad configurations. When the die are mounted to the substrate, they are thereby assigned the corresponding chip address. Each memory die will determine its address from the configuration applied to the pads. The device select pins provide the grounding configuration of the pads to the selection circuitry within the device. When the device is enabled, the selection circuitry compares addresses provided by the controller 210 with the grounding configuration to determine whether it should select and process a request.

In FIG. 2, memory device 2 is assigned the address '11' assuming ground represents logical '0' and an 'x' in the figure depicts a grounded pad. Memory device 2 is assigned address "10," memory device 3 is assigned address "01," and memory device 4 is assigned address "00." Only two pads are required for addressing the four individual memory die as depicted in FIG. 2, although a total of five device select pins and grounding pads for each die are shown.

The second set of pinouts 218 are device bus pinouts for connecting each memory die to the common device bus 220. The device bus 220 is connected to controller 210 at a first end and each of the individual memory die 202 at the other. The number of device bus pinouts 218 will vary according to implementation, particularly the requirements of the corresponding bus in the system. Each memory die is connected to the common bus to receive and respond to various control and address commands issued by controller 210. Thus, each chip has a chip enable input that receives an external chip enable signal from off the memory die. Control line 222 is depicted apart from device bus 220, although in various embodiments, it may be regarded as part of the device bus 220. Control line 222 is a master chip enable line. Each memory device may be enabled in response to a master chip enable signal provided by controller 210. In response to this chip enable signal, each device enables a set of input registers within the device. However, note that this master (or external in the sense that it is supplied externally to the memory die) chip enable line may be over-ridden to disable a defective memory die, in some embodiments. For example, an internal chip enable signal may be generated on the defective memory die.

A chip or array address is passed from the controller on the device bus 220 and shifted into the registers at each device while enabled. The selection circuitry 230 in each device compares the received array address with the unique address provided by the predetermined configuration of grounding for the set of pads 214 to determine if the memory device is to be selected. If so, the control circuitry for the memory die will process the request by reading data from or writing data to the array.

The device bus pinouts 218 of each memory die are tied together internally within the package. For example, the pinouts may each be connected to a common bonding pad. Once the die have been packaged together, it may not possible, or may not be practical, to physically alter the internal wiring to disconnect a bad die. Additionally, the pad bonding 214 for each memory die may be fixed as of the time of packaging. The predetermined configuration of the pads is applied and the memory die connected via the device select pins as part of the packaging process. Once the die are packaged, the configuration for the fixed pad bonding cannot be altered. In some cases, the chip enable and device select pins are fixed before detecting the failure of the die.

Each memory die 202 has a programmable element 1 for storing an indication of whether the memory die is defective in one embodiment. In the embodiment of FIG. 2, the programmable element 1 is in the memory array 206, although the programmable element 1 may be located outside of the memory array 206. In one embodiment, the programmable element 1 is in a portion of the memory array 206 that is used to store configuration parameters. For example, this region may store parameters such as voltages for programming and reading memory cells.

Moreover, even if the programmable element 1 cannot be trusted, a multi-die memory package may still be shipped. If it is determined upon POR that the programmable element 1 cannot be trusted, then that memory die is disabled, in accordance with one embodiment. In one embodiment, an internal chip enable for individual memory die is able to self-disable the memory die if the programmable element 1 cannot be trusted.

The control circuitry of each memory die in the embodiment of FIG. 2 includes a circuit 242 to isolate the memory die from the master (e.g., external) chip enable signal provided on the control line 222. The control circuitry of each memory die in the embodiment of FIG. 2 also includes a circuit 240 to replace or reprogram the unique address provided by the set of grounding pads. Although circuits 240 and 242 are depicted apart from the corresponding selection circuitry 230 of each memory die, these circuits could be included as part of the selection circuitry.

Numerous types of programmable elements can be used in order to store the data necessary for reprogramming the chip enable signal for a particular memory die. As noted example, the programmable element 1 could be some region in the memory array 206. The programmable element 1 could be some type of fuse circuitry. Because the fuse circuitry is programmed subsequent to device packaging, it should be writable in its packaged state.

ROM fuses may be especially suited for post-packaging programming as they are capable of being written to after molding and packaging processes. For instance, some electrically programmable fuses utilize traditionally programmable nonvolatile memory elements to store data in logic states. Usually, electrically programmable fuses can be accessed and programmed both before after device packaging. In one embodiment that uses programmable fuses, a portion of the main array of memory cells for the memory die can be used. Thus, the programmable element that indicates whether the memory die is defective may be stored somewhere in the memory array 206.

However, note that other types of devices can be used for the programmable element 1. For example, a ROM fuse that includes an anti-fuse element in one of two logic states including an unprogrammed, high-resistance state or a programmed, low-resistance state may be used. An unprogrammed anti-fuse link in a ROM array or register may have a resistance on the order of a gigaohm, and a programmed anti-fuse link may have a resistance on the order of a few hundred ohms. For programming a typical anti-fuse, a high voltage signal is applied to transfer the link from its initial high-resistance state to its programmed, low-resistance state. This serves to store a single bit of logic data.

Also, a programmable chip address may be provided. Failing die in multi-chip configurations may be isolated when their failure is detected after packaging. Where the failing die interrupts a continuous address range for the memory system, other die within the package can be re-addressed via the programmable chip address to provide a continuous address range in spite of the failed die.

One or more fuses for programmable chip address circuitry 240 can store and provide an alternate unique address for its corresponding memory die. In FIG. 2, each unique chip address is comprised of two bits to individually address the four memory die such that two fuses can be used to assign an alternate address. A third fuse can be used to store a value indicating whether the address provided by the fuses should be used in place of the standard address from the pad bonding. For instance, a memory die chip address can be reprogrammed by programming the third fuse to cause the chip address circuitry to be activated for replacing the chip address. In response to the third fuse being set to its programmed state, the logic values stored by the first two fuses can be provided to the selection circuitry in place of the unique address provided on the device select pins from the pad bonding. A fuse in its initial state can correspond to a logic '0' for example, and a fuse in its programmed state can correspond to logic '1.' If the third fuse is set, the values from the first two fuses are supplied as the input to the selection circuitry in place of the pad bonded address.

Figure 3:
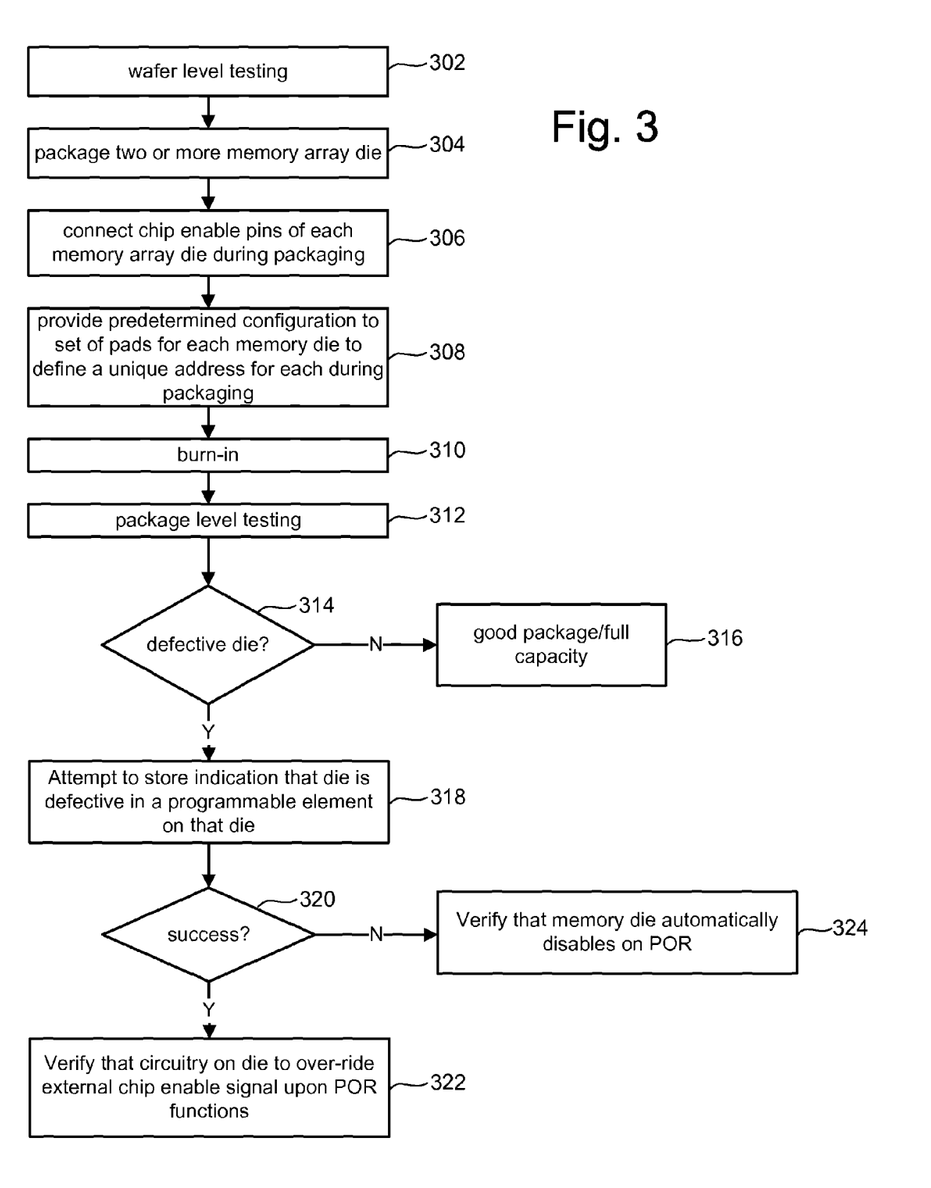
FIG. 3 is a flowchart describing a method of manufacturing semiconductor memory according to one embodiment.

A process of manufacturing non-volatile semiconductor memory devices is illustrated in FIG. 3, whereby a memory die is configured to automatically disable itself upon power on reset under certain conditions. An attempt may be made to store an indication of whether the memory die is defective in a programmable element. However, the memory die may be configured to disable itself upon POR if the programmable element cannot be trusted. Moreover, the memory die may also be configured to disable itself upon POR in response to the state of the programmable element, providing that the programmable element can be trusted.

Wafer level testing is performed at step 302 for a group of semiconductor wafers, each typically having a number of undivided memory array die which include the memory array and peripheral circuitry for controlling the memory array. After wafer level testing, the individual memory die of the wafers are divided and packaged at step 304. Single chip packages, multi-chip packages, both with and without controller chips can be packaged at step 304. A large variety of packaging configurations can be used. The die are typically mounted on a substrate with a conductive layer etched on one or both sides. Electrical connections are formed between the die and conductive layers(s), with the conductive layer(s) providing an electric lead structure for integration of the die into an electronic system.

As part of forming electrical connections between the die and conductive layer(s), the chip enable pins of each memory array are connected to a master chip enable line or to a common bus at step 306 to receive an external chip enable signal from the controller or host device. At step 308, a predetermined configuration is applied to the set of bond pads for the device select pins of each chip, thereby assigning each chip its own unique chip address. Selected pins may be configured to grounded pads to define an address as illustrated in the example of FIG. 3. Some die are provided with bond pads on the die that can be connected to electrical leads of a leadframe, for example, to define the unique chip address. Once the electrical connections between the die and substrate are made, the assembly is typically encased in a molding compound to provide a protective package.

An optional burn-in process as previously described for FIG. 1 can be performed at step 310 to stress the package, including the memory array(s), peripheral circuitry, controller, etc. After burn-in, testing is performed on the package at step 312. Numerous types of package-level tests can be applied, including by way of example, bit and word line tests to detect faults, shorts, etc., memory cell tests for reading, writing, and data retention, peripheral circuitry tests, etc. In some embodiments, redundant memory cells are used at step 312 after packaging to replace defective memory cells, individually or by blocks or columns, etc. of individual memory die.

If no memory die are determined to be defective, the process is complete and the packaged device is delivered at step 316 with full capacity. If one or more memory die are defective, then an attempt is made to store an indication that it is defective in a programmable element 1, at step 318. As noted, the programmable element 1 may be some region of the memory array 206, although the programmable element 1 could also be outside of the memory array 206.

In one embodiment, step 318 is performed as a part of writing device parameters to some portion of non-volatile memory such as a flash memory array, in one embodiment. For example, a region of the memory array 206 may be dedicated to storing various device parameters such as voltages at which the memory cells should be read, programmed, etc. This region of the memory array is thus not writeable by the user. Thus, the programmable element 1 can be a portion of this region without any chance of the programmable element 1 being over-written by the user.

In one embodiment, a checksum or hash sum is written to the region of memory, in step 318. Any checksum function or algorithm may be used to generate the checksum. In one embodiment, the data is read back to determine whether the region of the memory array was successfully programmed. In one embodiment, for every byte of actual data that is written, the compliment of the actual data is written. Each byte and its compliment may be read back and compared to determine whether the memory programmed correctly.

If step 318 successfully stores the indication in the programmable element, then the circuitry for self-disabling based on the state of the programmable element is tested in step 322. Note that step 322 may be used to determine whether circuit 242 is correctly functioning. In one embodiment, a POR reset is performed for each memory die for which the programmable element 1 was successfully written to. Memory die flagged as defective should automatically self-disable upon POR, in one embodiment. For example, these memory die should over-ride the external chip enable signal. On the other hand, memory die not flagged as defective should not self-disable upon POR.

Note that circuitry 242 may have been added to each memory die prior to the process of FIG. 3. For example, such circuitry 242 may have been added during the same semiconductor fabrication process that was used to manufactured the memory array and peripheral circuits on each memory die. Thus, a step of configuring circuitry 242 on the memory die to disable the memory die upon POR if the programmable element cannot be trusted may be performed, at least in part, during semiconductor fabrication process.

Even if step 318 is unable to successfully write to the programmable element 1, then the process will still attempt to use the memory package. In step 324, a test may be performed to verify that the memory die self-disables on POR. In one embodiment, the memory die is expected to check the validity of the region of the memory array that stores various parameters, as well as the programmable element. If this check indicates that this region cannot be trusted, then the memory die is expected to self-disable. Therefore, step 324 may verify that the memory die is correctly self-disabling itself. Note that step 324 may be used to determine whether circuit 242 is correctly functioning.

Figure 4:
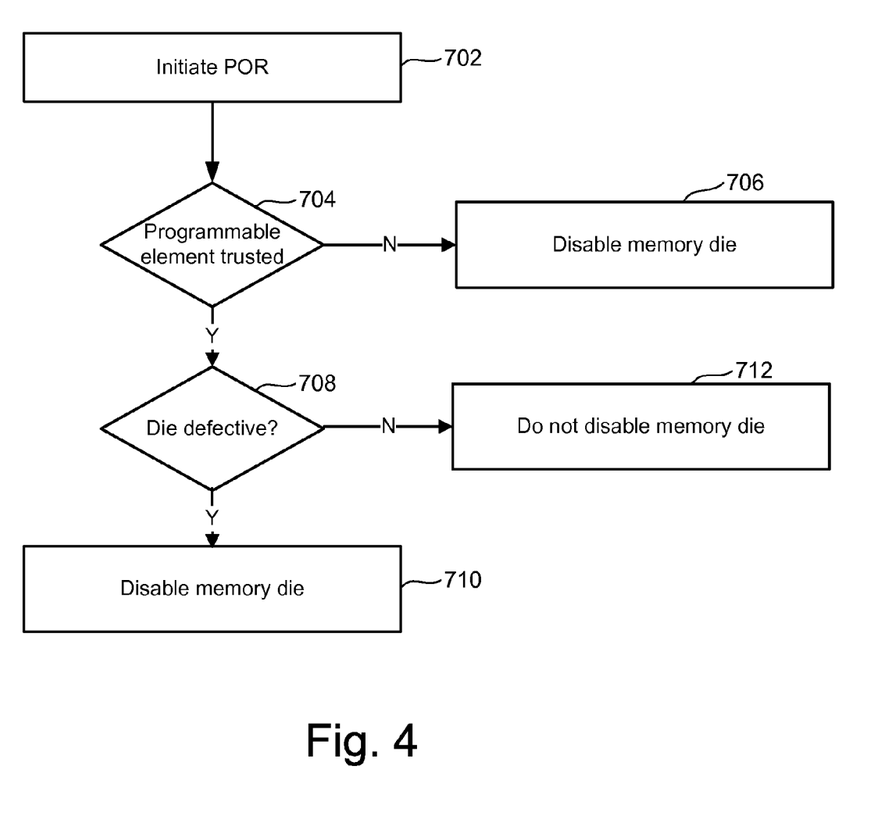
FIG. 4 is a flowchart describing a method of self-disabling a memory die according to one embodiment.

During use, each time that the memory package is powered on, it may go through a POR test. A part of the POR test may be to determine which of the memory die should be disabled. FIG. 4 is a flowchart of one embodiment of a process of self-disabling defective memory die upon POR. Note that a memory die having an untrusted programmable element 1 for storing an indication whether that die is defective may self-disable upon POR. Therefore, memory packages that contain one or more memory die with such a programmable element 1 that cannot be trusted may still be used. This increases the yield, as memory packages that might otherwise need to be discarded may still be used.

In step 702, a POR of the memory package is initiated. In one embodiment, each memory die undergoes a separate POR test. The process will be described with respect to one memory die.

In step 704, a determination is made whether a programmable element 1 for storing an indication whether that memory die is defective can be trusted. In one embodiment, the programmable element 1 is some region in non-volatile storage. For example, the programmable element 1 could be one or more flash memory cells in a memory array 206. The flash memory may be NAND, NOR, etc. However, the programmable element 1 is not required to be flash memory.

In one embodiment, step 704 includes determining whether the region in non-volatile storage of memory on the memory die passes a functionality test. In one embodiment, step 704 includes performing a checksum of a region of the memory array. As one example, a checksum is performed of a region that stores operational parameters (e.g., read voltages, program voltages, etc.), as well as containing the programmable element for indicating whether the memory die is defective.

If the programmable element cannot be trusted, then the memory die is disabled, in step 706. In one embodiment, the memory die is disabled by over-riding a chip enable signal. Step 706 may include generating an "internal chip enable signal" that is internal to the memory die and that overrides an "external chip enable signal" that is provided to the memory die As noted herein, the external chip enable signal may be common to each of the memory dice. An example circuit for generating a signal for over-riding a chip enable signal is depicted in FIG. 5.

If the programmable element 1 can be trusted, then the programmable element is read to determine whether the memory die is marked as being defective, in step 708. If so, then the memory die is disabled in step 710. For example, an external chip enable signal is over-ridden.

On the other hand, if the programmable element 1 indicates that the memory die is not defective, then the memory die is not disabled, in step 712. For example, the external chip enable signal is allowed to pass through such that it may enable the memory die.

Figure 5:
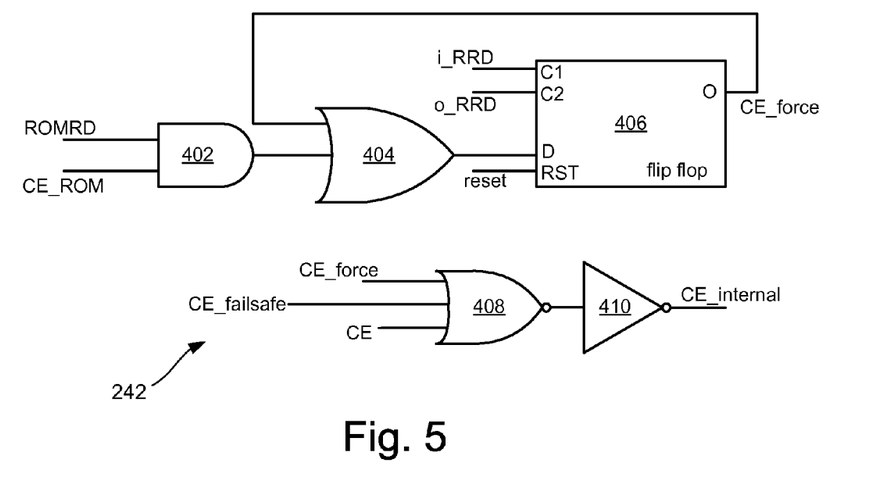
FIG. 5 is a circuit diagram of a portion of programmable chip enable circuitry of one embodiment.

FIG. 5 is a schematic illustration of a programmable chip enable circuit 242 in accordance with one embodiment. In general, CE is the master or external chip enable signal. The master chip enable signal may be common to all memory dice. The signal CE_force is generated to over-ride CE in the event that the programmable element 1 indicates that the memory die is defective. However, as noted herein sometimes the programmable element 1 that stores the flag cannot be trusted. For example, a region in the memory array that stored chip parameters (and contains the programmable element) cannot be trusted. In this event, the signal CE_force cannot be trusted. Therefore, the signal CE_failsafe may be generated to over-ride CE in the event that the programmable element 1 cannot be trusted. The output of element 408 is CE_internal, which is an internally generated chip enable.

A ROMRD timing signal is provided as a first input to gate 402. A data signal (CE_ROM) from the programmable element 1 is provided as a second input. If the programmable element 1 is in a first state, the gate 402 is not enabled in response to the timing signal ROMRD. That is, the first state indicates that the memory die is not defective. In various embodiments, the timing signal can be asserted at power up or power down, for example, to cause the data from the programmable element 1 to be read. If the gate 402 is not enabled by programmable element 1, the gate output remains LOW and the output CE_force remains LOW. As such, the master (or external) chip enable signal is passed to selection circuitry as described below in FIG. 6.

If the programmable element 1 is in a second state, then CE_ROM will be high when the ROMRD timing signal is issued and the output of gate 402 goes HIGH. That is, the second state indicates that the memory die is defective. The output of OR gate 404 goes HIGH when the output of gate 402 goes high. The HIGH value from the output of the OR gate is sampled by the flip flop 406, in response to timing signals i_RRD and o_RRD. The sampled HIGH value is then provided as output CE_force.

Figure 6:
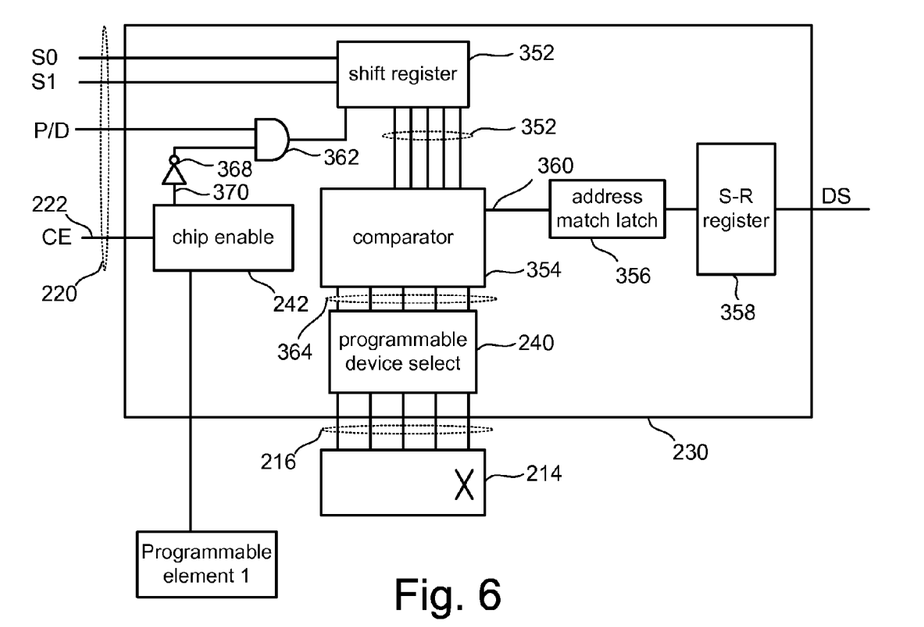
FIG. 6 is a block diagram of selection circuitry for a memory die.

The output CE_force is provided to NOR gate 408 with a sampled value of the external chip enable signal CE from the chip enable pin. An input buffer (not illustrated) can be used for the sampled value. If CE_force goes HIGH as a result of the state of the programmable element 1, the output of NOR gate 408 is LOW. The output is inverted by inverter 410 and provided as an internal chip enable signal CE_internal. The HIGH CE_internal output will be provided to inverter 368 which provides a LOW output to gate 362 (FIG. 6). Thus, the shift register 352 is disabled, resulting in a disabled memory die.

As noted, in some cases, the programmable element 1 is not trusted. In such an event, this means that the signal CE_force cannot be trusted. Therefore, a signal CE_failsafe may be provided to NOR gate 408 to over-ride the external chip enable CE. Thus, the signal CE_failsafe has a state that does not affect the output of NOR gate 408 so long as the programmable element 1 is trusted. However, if the programmable element 1 is not trusted, the state of CE_failsafe may over-ride the external chip enable CE. As one example, if CE_failsafe goes HIGH as a result of the the programmable element 1 not being trusted, the output of NOR gate 408 is LOW. The output is inverted by inverter 410 and provided as an internal chip enable signal CE_internal. The HIGH CE_internal output will be provided to inverter 368 which provides a LOW output to gate 362 (FIG. 6). Thus, the shift register 352 is disabled, resulting in a disabled memory die.

Note that in some embodiments, memory die may receive new addresses. FIG. 6 schematically illustrates selection circuitry 230 in one embodiment. In FIG. 6, the programmable circuitry is depicted as part of selection circuitry 230 although it need not be in all implementations. The selection circuitry generally includes a shift register 352, comparator 354, address match latch 356, and S-R register 358. The selection circuitry has inputs from the device select pins 216 and the device bus 220, including the chip enable line 222. The selection circuitry has an output DS to select or deselect the device (memory die) it is controlling.

Comparator 354 and address match latch 356 implement address matching for the memory die. In the example of FIG. 6, a two-bit address is shifted into shift register 352 from the serial lines S0 and S1 of device bus 220. A clocking signal is carried on control line P/D which is gate-enabled by a LOW signal on the master chip enable line 222 which is inverted by inverter 368. Master chip enable line 222 is shown as part of device bus 220 in FIG. 6. The two-bit unique chip address is then passed from the shift register 352 to the comparator 354.

With the programmable chip address circuitry in its initial state, the comparator receives the unique chip address obtained from the device select pinouts 216 as a second input. As earlier described, the address for each location within the array is defined by the grounding configuration or "key" of the bonding pads 214. By virtue of the memory die connecting to a particular mount on the board, for example, the address defined by the pads of the mount are passed onto the memory device via the device select pinouts.

The comparator compares the address received on the serial lines S0 and S1 with that obtained on the device select pins. If the addresses match, the comparator output 360 goes HIGH. This output is clocked into the address-match register 356 by the falling edge of the of the chip enable signal on the chip enable line CE 222 (connection not shown). This results in an S-R register 358 being set HIGH such that the output DS is also high and the device is selected. When the addresses do not match, DS will be LOW and the device is not selected.

Chip enable circuitry 242 may be utilized to isolate a particular memory die from the package. This may be accomplished by isolating the die from the master chip enable line to disable the memory die so that it remains unselected. The chip enable circuitry 242 simply pass the external chip enable signal received via master chip enable line 222 directly to inverter 368 to control gate 362, in the event that the memory die is not to be disabled. The selection circuitry operates in its normal mode so that the chip enable signal enables clocking signal P/D to shift the address on the serial lines S0 and S1 into the shift register 352.

If the programmable element 1 is either untrusted or indicates that the memory die is defective, the corresponding memory die is isolated from the chip enable line 222. Gate 362 is enabled by the master chip enable signal going LOW. Accordingly, the circuitry 242 can drive a HIGH signal on line 370 in place of the chip enable signal that would normally be passed thereon. As noted, if the memory die determines that the programmable element 1 cannot be trusted, then the circuitry 242 can also drive a HIGH signal on line 370 in place of the chip enable signal that would normally be passed thereon. In this manner, regardless of the external chip enable signal provided by the host or controller on the chip enable line, the gate will remain off and the clocking signal will not enable the shift register 352 to receive the unique chip address on the serial lines S0 and S1. By disabling the input shift register 352, the corresponding memory die is disabled, and will remain so, independently of the chip enable signal.

Programmable device select circuitry 240 may be utilized to reprogram the unique chip address for a particular memory die in the package. The device select input pins are connected to the programmable device select circuitry, which will pass the signals thereon directly to comparator 240 when the programmable circuitry is in its initial operating state. A first fuse can store a single bit to indicate that the chip address received on the device select pins is to be overridden. When this bit is asserted, the programmable device select circuitry provides a different unique address to comparator 354, thus overriding the chip address provided by the physical bonding. A number of fuses corresponding to the number of bits in the unique chip address are used to provide the different address. For instance, the initial resistance state of the fuse may correspond to logic '0' and the programmed low-resistance state may correspond to logic '1,' or vice-versa. The address fuses can be selectively conditioned to store the new chip address. The programmable circuitry will then provide this address on bus 364 to the comparator. As such, the memory die has been reprogrammed with a new unique chip address after packaging.

Figure 7:
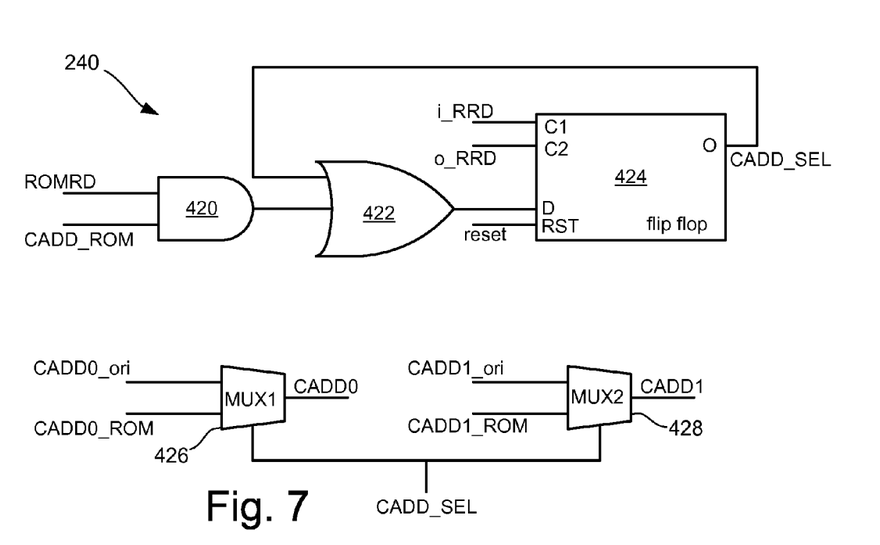
FIG. 7 is a circuitry diagram of a portion of programmable chip address circuitry.

FIG. 7 is a schematic illustration of programmable device select circuitry 240 in one embodiment. A ROMRD timing signal and the output of a first ROM fuse (referred to as a selection fuse) are provided to gate 420. When the timing signal ROMRD goes HIGH, the data from the programmable element 1 is provided to the gate. In FIG. 7, the signal CADD_ROM may be HIGH if either the programmable element 1 is not trusted or if it indicates that the memory die is defective. If, CADD_ROM is LOW, then the gate 420 output remains low and the output of flip flop 424 is low. If CADD_ROM is HIGH, the output of gate 420 goes HIGH and the OR gate output 422 goes HIGH. The output CADD_SEL of flip flop 424 then goes HIGH in response to timing signals i_RRD and o_RRD.

The lower portion of the circuitry in FIG. 7 is used to select either the original chip address provided by the pad bonding or the programmed address provided by the programmable circuitry. A first multiplexer MUX1 426 receives two inputs, CADD0_ori and CADD0_ROM for the first bit of the chip address. CADD0_ori is the signal from the pad bonding for the first bit of the chip address. CADD0_ROM is the signal from a first ROM fuse for the first address bit. A second multiplexer MUX2 428 receives two inputs, CADD1_ori and CADD1 ROM for the second bit of the chip address. CADD1_ori is the signal from the pad bonding for the second bit of the chip address. CADD1_ROM is the signal from a second ROM fuse for the second address bit. If CADD_SEL is low, corresponding to an unprogrammed selection ROM fuse for the programmable device select circuitry, the original chip address is provided from the multiplexers. MUX1 provides an output CADD0 for the first bit of the chip address from the pad bonding (CADDO_ori) and MUX2 provides an output CADD1 for the second bit of the chip address from the pad bonding (CADD2_ori). If CADD_SEL is high, corresponding to the programmed element 1 either being untrusted or indicating that the memory die is defective, then the programmed chip address from each of the ROM fuses is provided. MUX1 provides the CADD0_ROM value from the first address ROM fuse on output CADD0 and MUX2 provides the CADD1_ROM value from the second address ROM fuse on output CADD1.

The exemplary embodiment of FIGS. 5-7 utilizes a two-bit address. Accordingly, the multiplexers receive two inputs and two ROM fuses are used for a replacement chip address. If more bits are utilized for a chip address, additional ROM fuses can be used for the additional bits of the address.

Figure 8:
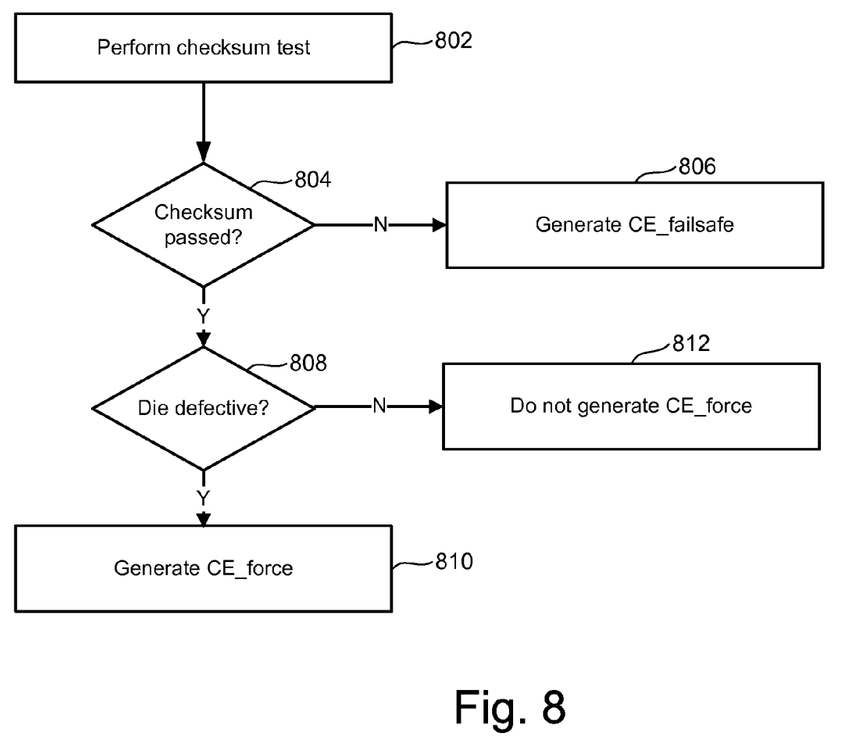
FIG. 8 is a flowchart describing a method of generating control signals for self-disabling a defective memory die according to one embodiment.

FIG. 8 is a flowchart of one embodiment of a process of generating control signals to enable/disable a memory die. The process may be performed by each memory die upon POR. In step 802, a checksum test is performed. This is one embodiment of step 704 of FIG. 4. The checksum test may be of some region of a memory array 206 of the memory die. This may be a flash memory array, such as NAND, NOR, etc. The region of memory may be for storing operational parameters. Note that this region of the memory array contains the programmable element 1. Thus, the programmable element 1 may be one or more flash memory cells.

In one embodiment, the checksum test is performed as follows. Note that in this example, for each byte of actual data that was written, a byte of its compliment is written. Thus, each byte of data in the region of memory array for storing operational parameters may be read. Then, a comparison of each byte of actual data with the byte storing its compliment is made. Note that many other types of checksum tests could be performed. If the checksum of the region of memory array passes, then the programmable element 1 is trusted. Otherwise, the programmable element 1 is not trusted. Note that in other embodiments, other tests are performed to determine whether the programmable element 1 is trusted.

If the checksum test fails, then it is determined that the programmable element 1 cannot be trusted. Thus, in step 806 the control signal CE_failsafe is generated. For example, CE_failsafe is set to HIGH. This signal was discussed with respect to the circuit of FIG. 5. Note that CE_failsafe will over-ride the external chip enable signal (CE). This will effectively disable the memory die. In one embodiment, the signal CADD_ROM is set to HIGH also (see FIG. 7).

If the checksum test passes, then a determination is made whether the programmable element 1 indicates whether the memory die is defective, in step 808. As noted, the programmable element 1 may be within a region of memory for which the checksum was performed, in this embodiment. Note that in other embodiments, the the programmable element 1 is not required to be a flash memory cell.

If the programmable element 1 indicates the memory die is defective, then the control signal CE_force is generated in step 810. This signal was discussed with respect to FIG. 5. As noted, the signal CE_force will effectively over-ride the external chip enable signal CE. Also note that the signal CE_failsafe is not generated in this case. In one embodiment, the signal CADD_ROM is set to HIGH also (see FIG. 7).

If the programmable element 1 indicates the memory die is not defective, then the signal CE_force is not generated in step 812. For example, CE_force is set to LOW. Also note that the signal CE_failsafe is not generated in step 812. For example, CE_failsafe is set to LOW. Therefore, the external chip enable signal CE is not over-ridden. Therefore, the external chip enable signal CE is allowed to enable the memory die. Herein, this is referred to as "not disabling the memory die." That is, by not disabling the memory die it will be understood that the external chip enable signal CE controls whether the memory die is enabled. In one embodiment, the signal CADD_ROM is set to LOW in step 812 (see FIG. 7).

Figure 9:
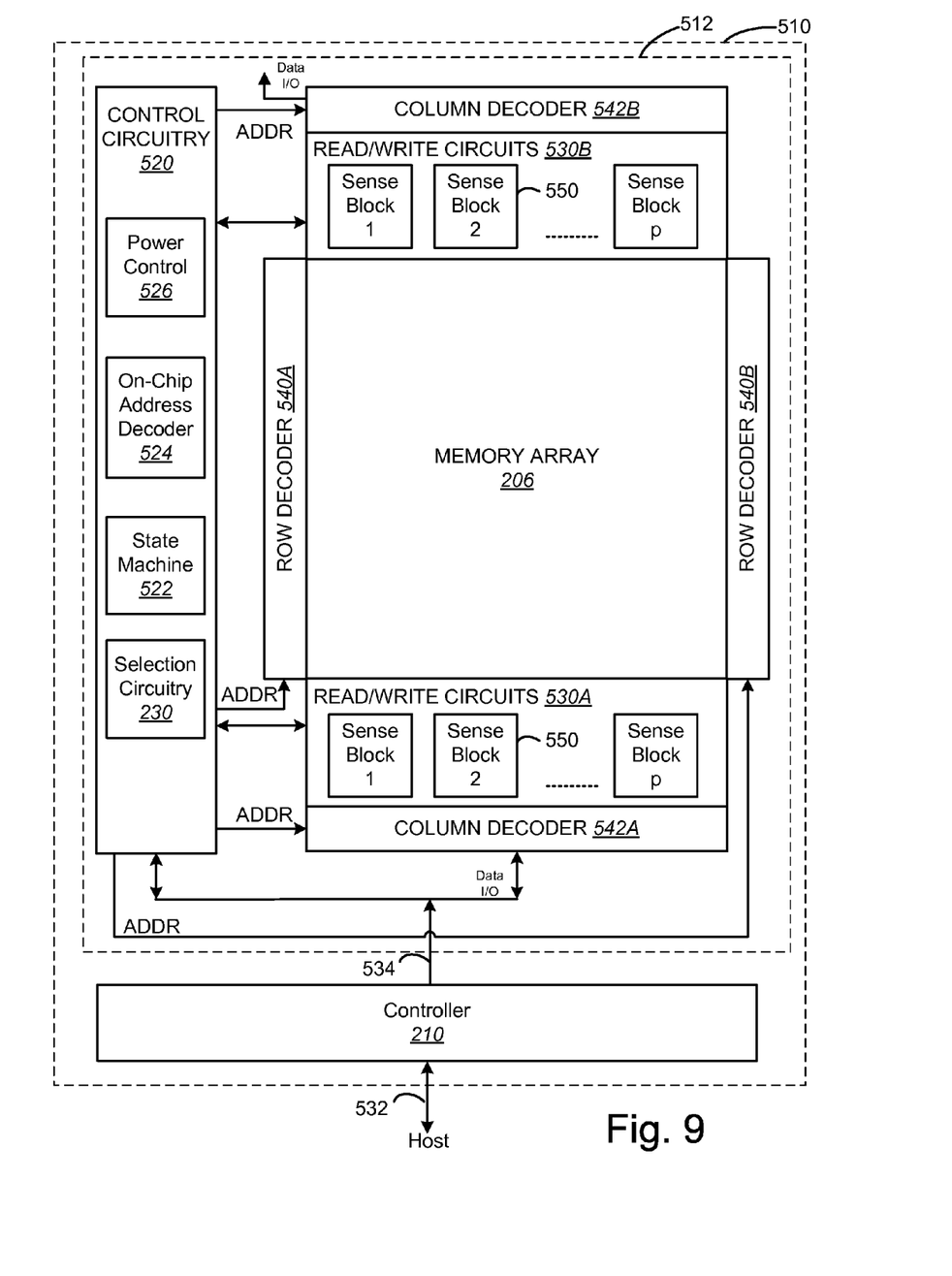
FIG. 9 is a block diagram of a non-volatile memory system.

FIG. 9 is another view of a non-volatile memory system such as that depicted in FIG. 3, showing additional components as may be included in some implementations. Memory device 510 includes one or more memory die or chips 512. Memory die 512 includes a two-dimensional array of memory cells 206, control circuitry 520, and read/write circuits 530A and 530B. In one embodiment, access to the memory array 206 by the various peripheral circuits is implemented in a symmetric fashion, on opposite sides of the array, so that the densities of access lines and circuitry on each side are reduced by half. The read/write circuits 530A and 530B include multiple sense blocks 550 which allow a page of memory cells to be read or programmed in parallel. The memory array 206 is addressable by word lines via row decoders 540A and 540B and by bit lines via column decoders 542A and 542B. In a typical embodiment a controller 544 is included in the same memory device 510 (e.g., a removable storage card or package) as the one or more memory die 512. Commands and data are transferred between the host and controller 544 via lines 532 and between the controller and the one or more memory die 512 via lines 534 which can be device bus 220.

The control circuitry 520 cooperates with the read/write circuits 530A and 530B to perform memory operations on the memory array 206. The control circuitry 210 includes a state machine 522, an on-chip address decoder 524 and a power control module 526. The state machine 522 provides chip-level control of memory operations. The on-chip address decoder 524 provides an address interface between that used by the host or a memory controller to the hardware address used by the decoders 540A, 540B, 542A, and 542B. The power control module 526 controls the power and voltages supplied to the word lines and bit lines during memory operations.

Selection circuitry 230 is part of control circuitry 520 in one embodiment. The control circuitry can form a part of the state machine or can be a stand alone circuit component. As such, the circuitry 240 and 242 can be included in the control circuitry and state machine as well. Note the memory array 206 may contain the programmable element 1.

One embodiment includes a method comprising determining whether a programmable element on a memory die for indicating whether the memory die is defective can be trusted, and overriding a chip enable signal that is provided to the memory die if the programmable element cannot be trusted. The memory die is a first memory die of a plurality of memory dice in a memory package.

One embodiment includes a non-volatile storage device comprising a plurality of memory dice. Each memory die has a chip enable input that receives an external chip enable signal from off the memory die, a programmable element for storing an indication of whether the memory die is defective, and a circuit in communication with the chip enable input. The circuit overrides the external chip enable signal if the programmable element is not trusted.

One embodiment includes a method of manufacturing non-volatile storage, which includes the following. A plurality of non-volatile memory dice are packaged in a memory package. Each memory die has a programmable element for storing an indication whether that memory die is defective. A determination is made whether each memory die in the memory package is defective. This determination is performed after packaging the plurality of non-volatile memory dice in the memory package. A determination is made whether the programmable element for each individual memory die can be trusted. An indication of whether or not the memory die is defective is stored in the programmable element for each memory die for which the programmable element can be trusted. Circuitry on the memory die is configured to disable the memory die upon power on reset for any of the memory dice for which the programmable element cannot be trusted. Note that configuring this circuitry may be performed prior to packaging. Circuitry on the memory die is configured to override a chip enable signal to the memory die upon power on reset for any of the memory dice for which the programmable element can be trusted and indicates that the memory die is defective. Note that configuring this circuitry may be performed prior to packaging.

One embodiment includes non-volatile storage device comprising a plurality of memory dice. An individual memory die has one or more flash memory arrays, a chip enable input that receives an external chip enable signal from off the memory die, and a region of flash memory for storing an indication of whether the memory die is defective. The individual memory die also has a circuit in communication with the chip enable input, the circuit is configured to override the external chip enable signal if the region of flash memory fails a functionality test on power on reset in order to disable the memory die.

The foregoing detailed description of embodiments has been presented for purposes of illustration and description. It is not intended to be exhaustive or to limit embodiments to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A method comprising:
determining whether a programmable element on a memory die for indicating whether the memory die is defective can be trusted, the memory die is a first memory die of a plurality of memory dice in a memory package; and
overriding a chip enable signal that is provided to the first memory die if the programmable element cannot be trusted.

2. The method of claim 1, further comprising:
overriding the chip enable signal to the first memory die if the programmable element can be trusted and if the programmable element indicates that the memory die is defective.

3. The method of claim 1, wherein the programmable element is a region of memory on the first memory die, the determining whether the programmable element can be trusted includes:
determining whether the region of memory on the first memory die passes a functionality test.

4. The method of claim 3, wherein the determining whether the region of memory on the first memory die passes a functionality test includes:
determining whether the region of memory on the first memory die passes a checksum test.

5. The method of claim 3, wherein the determining whether the region of memory on the first memory die passes a functionality test is performed at power on reset.

6. The method of claim 1, wherein the overriding the chip enable signal includes generating an internal chip enable signal that is internal to the first memory die that overrides an external chip enable signal that is provided to the first memory die.

7. The method of claim 6, further comprising providing the external chip enable signal to each of the plurality of memory dice.

8. A non-volatile storage device comprising:
a plurality of memory dice, each memory die having:
a chip enable input that receives an external chip enable signal from off the memory die;
a programmable element for storing an indication of whether the memory die is defective; and
a circuit in communication with the chip enable input, the circuit overrides the external chip enable signal if the programmable element is not trusted.

9. The non-volatile storage device of claim 8, wherein the circuit overrides the external chip enable signal if the programmable element is trusted and the programmable element indicates that the memory die is defective.

10. The non-volatile storage device of claim 8, wherein the chip enable inputs of the plurality of memory dice are electrically connected.

11. The non-volatile storage device of claim 8, wherein the programmable element is a ROM fuse that is capable of being written to after molding and packaging processes.

12. The non-volatile storage device of claim 8, wherein the programmable element is a region of non-volatile storage.

13. The non-volatile storage device of claim 12, wherein the circuit is able to determine whether the programmable element can be trusted by determining whether the region of non-volatile storage passes a functionality test.

14. The non-volatile storage device of claim 12, wherein the circuit is able to determine whether the programmable element can be trusted by determining whether the region of non-volatile storage passes a checksum test.

15. A method of manufacturing non-volatile storage, comprising:
packaging a plurality of non-volatile memory dice in a memory package, each memory die having a programmable element for storing an indication whether that memory die is defective;
determining whether each memory die in the memory package is defective, the determining is performed after packaging the plurality of non-volatile memory dice in the memory package;
determining whether the programmable element for each individual memory die can be trusted;
storing an indication of whether or not the memory die is defective in the programmable element for each memory die for which the programmable element can be trusted;
configuring circuitry on the memory die to disable the memory die upon power on reset for any of the memory dice for which the programmable element cannot be trusted; and
configuring circuitry on the memory die to override a chip enable signal to the memory die upon power on reset for any of the memory dice for which the programmable element can be trusted and indicates that the memory die is defective.

16. A method comprising:
determining whether a region of flash memory on a memory die passes a functionality test, the determining is performed upon power on reset, the region of flash memory includes a portion for indicating whether the memory die is defective, the memory die is one of a plurality of memory dice in a non-volatile storage device; and
overriding an external chip enable signal that is input to the memory die if the region of flash memory fails the functionality test upon power on reset, the overriding is performed internally on the memory die.

17. The method of claim 16, further comprising:
overriding the external chip enable signal to the memory die if the region of flash memory passes the functionality test upon power on reset and the portion for indicating whether the memory die is defective indicates that the memory die is defective, the overriding is performed internally on the memory die.

18. The method of claim 16, wherein the region of flash memory includes NAND memory cells, the portion for indicating whether the memory die is defective includes one or more NAND memory cells, the determining whether the region of flash memory passes the functionality test includes performing a checksum of the NAND memory cells.

19. The method of claim 16, wherein the overriding an external chip enable signal that is provided to the memory die if said programmable element cannot be trusted includes:
generating a control signal on the memory die; and
providing the control signal to circuitry on the memory die that inputs the external chip enable signal that is common to all of the memory dice, the control signal forces the circuitry to override the external chip enable signal such that the memory die is disabled.

20. A non-volatile storage device comprising:
a plurality of memory dice, an individual memory die having:
one or more flash memory arrays;
a chip enable input that receives an external chip enable signal from off the memory die;
a region of flash memory for storing an indication of whether the memory die is defective; and
a circuit in communication with the chip enable input, the circuit is configured to override the external chip enable signal if the region of flash memory fails a functionality test on power on reset in order to disable the memory die.

21. The non-volatile storage device of claim 20, wherein the circuit of an individual memory die is configured to override the external chip enable signal if the region of flash memory passes the functionality test upon power on reset and the region stores an indication that the individual memory die is defective.

22. The non-volatile storage device of claim 20, wherein the circuit of an individual memory die is configured to perform the functionality test on power on reset.

23. The non-volatile storage device of claim 22, wherein the circuit of an individual memory die performs a checksum of the region of flash memory to perform the functionality test on power on reset.

24. The non-volatile storage device of claim 22, wherein the circuit of an individual memory die generates a control signal in response to the region of flash memory failing the functionality test, the circuit provides the control signal to circuitry that inputs the external chip enable signal that is common to all of the memory dice, the control signal forces the circuitry to override the external chip enable signal such that the individual memory die is disabled.

* * * * *